United States Patent
Warnes

(10) Patent No.: US 9,292,392 B2
(45) Date of Patent: Mar. 22, 2016

(54) MEMORY MODULE THAT INCLUDES A MEMORY MODULE COPY ENGINE FOR COPYING DATA FROM AN ACTIVE MEMORY DIE TO A SPARE MEMORY DIE

(75) Inventor: Lidia Warnes, Roseville, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 163 days.

(21) Appl. No.: 14/123,091

(22) PCT Filed: Jun. 30, 2011

(86) PCT No.: PCT/US2011/042564
§ 371 (c)(1),
(2), (4) Date: Nov. 27, 2013

(87) PCT Pub. No.: WO2013/002799
PCT Pub. Date: Jan. 3, 2013

(65) Prior Publication Data
US 2014/0082411 A1    Mar. 20, 2014

(51) Int. Cl.
G06F 11/00 (2006.01)
G06F 11/16 (2006.01)
G11C 29/00 (2006.01)
G11C 29/04 (2006.01)

(52) U.S. Cl.
CPC .......... G06F 11/1666 (2013.01); G11C 29/88 (2013.01); G11C 2029/0409 (2013.01); G11C 2207/2236 (2013.01)

(58) Field of Classification Search
CPC .... G06F 11/1666; G11C 29/76; G11C 29/88; G11C 29/883; G11C 29/886
See application file for complete search history.

(56) References Cited

U.S. PATENT DOCUMENTS

| 5,835,436 | A | * | 11/1998 | Ooishi ..................... 365/230.03 |
| 6,292,383 | B1 | | 9/2001 | Worley |
| 6,480,982 | B1 | | 11/2002 | Chan et al. |
| 7,088,624 | B2 | | 8/2006 | Daniel et al. |
| 7,178,072 | B2 | | 2/2007 | Mullins et al. |
| 8,412,985 | B1 | * | 4/2013 | Bowers et al. ................. 714/42 |
| 8,468,419 | B2 | * | 6/2013 | Dudeck et al. ............... 714/763 |
| 2006/0020850 | A1 | | 1/2006 | Jardine et al. |
| 2008/0209282 | A1 | | 8/2008 | Lee et al. |
| 2008/0270675 | A1 | * | 10/2008 | Nagaraj et al. ................ 711/100 |
| 2008/0270826 | A1 | | 10/2008 | Shaw et al. |
| 2009/0031078 | A1 | * | 1/2009 | Warnes et al. ................ 711/105 |
| 2010/0110745 | A1 | | 5/2010 | Jeddeloh et al. |
| 2010/0177579 | A1 | | 7/2010 | Katayama et al. |

FOREIGN PATENT DOCUMENTS

CN    1348191    5/2002
DE    102010030748    1/2011

OTHER PUBLICATIONS

ISA/KR, International Search Report, mailed Feb. 29, 2012, PCT/US2011/042564, filed Jun. 30, 2011.

* cited by examiner

*Primary Examiner* — Joseph Kudirka
(74) *Attorney, Agent, or Firm* — Brooks, Cameron & Huebsch, PLLC

(57) ABSTRACT

A memory module includes a memory module copy engine for copying data from an active memory die to a spare memory die. Access is mapped away from the active memory die to the spare memory die.

14 Claims, 8 Drawing Sheets

MEMORY MODULE THAT INCLUDES A MEMORY MODULE COPY ENGINE FOR COPYING DATA FROM AN ACTIVE MEMORY DIE TO A SPARE MEMORY DIE

BACKGROUND

In the art of computing, memory modules are typically used to store program code and data accessed by a processor. One common type of memory module known in the art is the dual inline memory module (DIMM). Today, a typical memory module comprises dynamic random access memory (DRAM) integrated circuits (ICs). The memory ICs, also known as memory dies, are provided in packages, the packages are attached to memory modules, and the memory modules are inserted into memory slots of a computer system.

On occasion a memory die will suffer a data error and not properly retain data that was previously stored. Various techniques are known for detecting and correcting memory data errors.

BRIEF DESCRIPTION OF THE DRAWINGS

The Figures depict examples, implementations, and configurations of the invention, and not the invention itself.

DETAILED DESCRIPTION

In the foregoing description, numerous details are set forth to provide an understanding of the examples disclosed herein. However, it will be understood by those skilled in the art that the examples may be practiced without these details. While a limited number of examples have been disclosed, those skilled in the art will appreciate numerous modifications and variations therefrom. It is intended that the appended claims cover such modifications and variations as fall within the true spirit and scope of the examples.

The examples provided herein relate to deploying spare memory dies when an active memory die fails or becomes unreliable. In accordance with the examples disclosed herein, data is copied from a failing die to a spare die, and then the failing die is retired and the spare die becomes an active die.

Some configurations in the art provide a spare memory module. If a memory module begins to fail or fails, the memory controller maps in the spare memory module and makes the spare memory module active, and retires the failing or failed memory module. Generally, only a single memory die on the retired memory module experienced memory errors, so many good memory die on the memory module are also retired.

There has been a trend to provide more devices on memory modules and to reduce the total number of memory modules in computer systems. Two technologies are accelerating this trend, 3D stacking (3DS) technology and through silicon via (TSV) technology. 3DS technology allows individual memory die to be sandwiched together into a structure of 4, 8, 16, or more die layers, and TSV technology allows signals to be electrically coupled between die layers. The stack of dies is then provided in a single package. Accordingly, the 3DS and TSV technologies can increase memory density by a factor of 16 or more without increasing the number of packages provided on a memory module.

As mentioned above, the process of sparing a whole memory module because a single memory die on the module has experienced memory errors often results in good memory die being retired. Examples disclosed herein adapt to advances in technology by moving the granularity of die sparing into the memory module, and also into a package having stacked memory dies.

Figure 1:
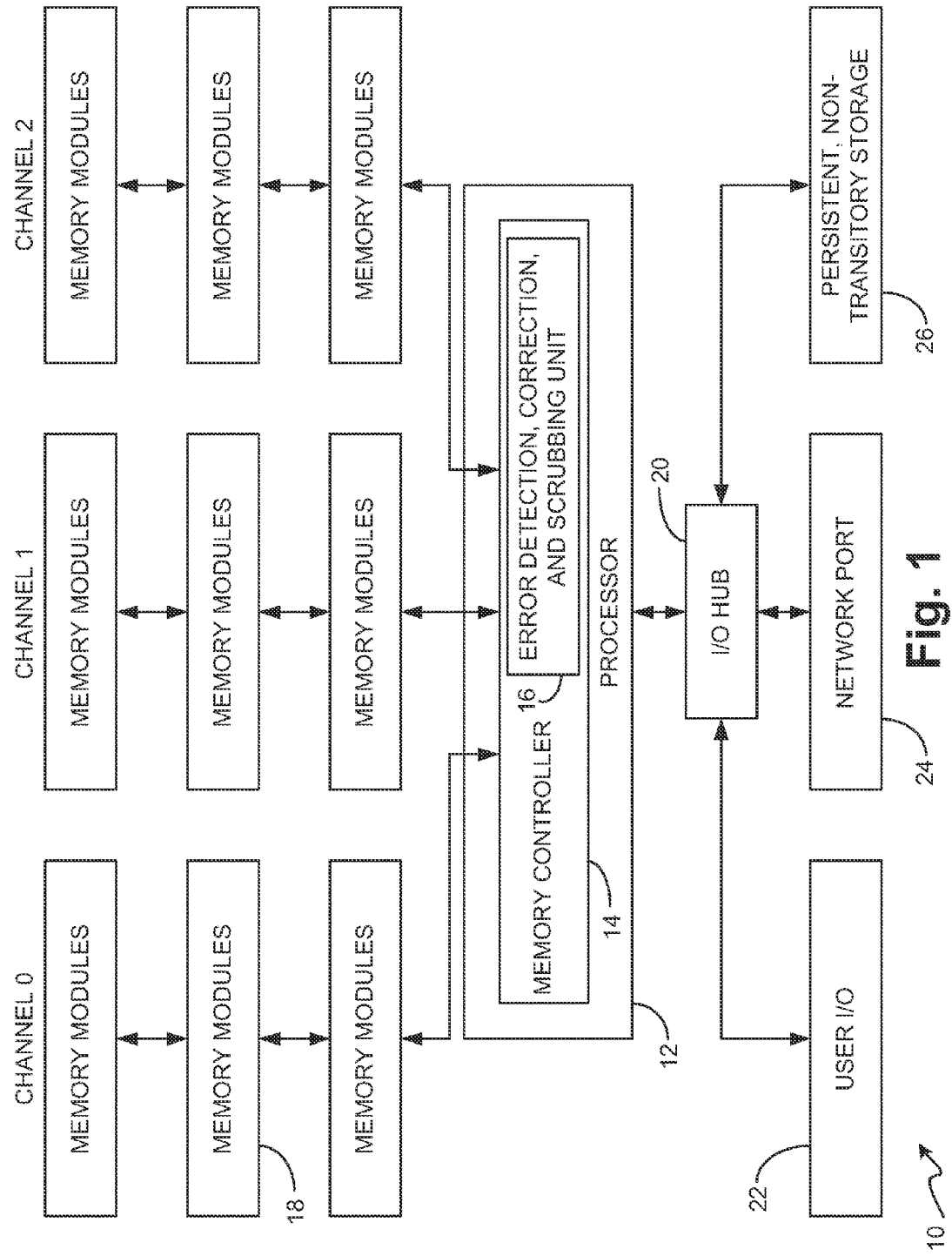
FIG. 1 shows an example of a computer system implementation that includes a processor having an integrated memory controller and three memory channels, with each memory channel having three memory modules.

FIG. 1 shows an implementation example of computer system 10. Computer system 10 includes a processor 12. As is common with modern processors, processor 12 includes an integrated memory controller 14. However, external memory controllers may also be used, as are shown in later figures. Memory controller 14 includes error detection, correction, and scrubbing unit 16, which can detect and correct errors during normal memory accesses. Unit 16 can also actively scrub memory by scanning memory to look for errors, and correct any correctable errors that are discovered.

Memory controller 14 supports three memory channels, and each memory channel has three memory modules, such as memory module 18. The memory channels can operate in independent mode or lockstep mode. Often the memory modules will be implemented as dual inline memory modules (DIMMs) that are inserted into memory slots. Note that the signal lines connecting memory controller 16 to the memory modules include system data, address, clocking, and control signals, as are known in the art, and also include copy signals, as will be discussed in greater detail below.

Also coupled to processor 12 is I/O hub 20, which in turn is coupled to user I/O 22, network port 24, and persistent, non-transitory storage 26. User I/O represents all forms of user I/O, such as keyboards, pointing devices, display adapters and monitors, speakers, microphones, and the like. Network port 24 allows computer system 10 to be coupled to a network. Persistent, non-transitory storage 26 represents storage associated with computer system 10, including hard disk drives, solid state drives, optical drives, network attached storage, and firmware, including system firmware routines that initialize computer system 10. Note that many of the functions described herein may be stored in system firmware that is loaded when computer system 10 is initialized.

Figure 2:
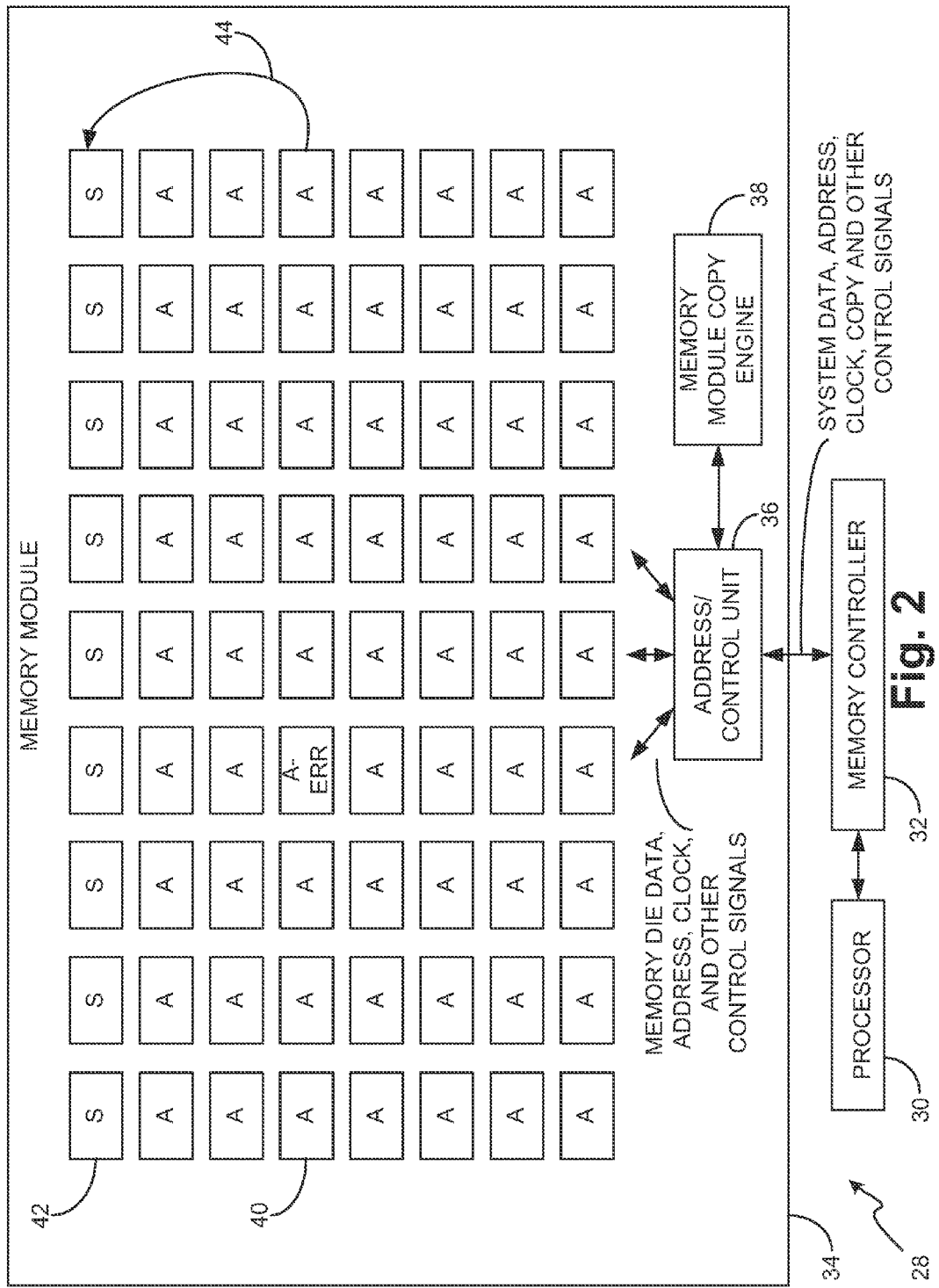
FIG. 2 shows a portion of a computer system that includes a processor, a memory controller, and a memory module.

FIG. 2 shows a portion of a computer system 28 that includes a processor 30, a memory controller 32, and a memory module 34. Note that in this case, computer system 28 has a memory controller 32 external to processor 30. However, the sparing mechanisms presented herein function substantially the same with either integrated or external memory controllers. Note that computer system 28 may include other components and functions discussed above with respect to computer system 10 of FIG. 1.

Memory module 34 includes 72 memory dies arranged in rows and columns. In this example, each row of nine memory dies represents a sub-rank, with the memory dies in a sub-rank all being selected and accessed at the same time during a memory access operation. The memory dies are labeled either S for spare, A for active, or A-ERR for active with a detected error. Note that dies may be provided individually, or may be stacked using the 3DS and TSV technologies discussed above.

Note that memory module 34 also includes an address/control unit 36 and a memory module copy engine 38. Memory module copy engine 38 is shown in FIG. 2 as an independent function. However, memory module copy engine 38 may be integrated with address/control unit 36, which performs address and control mapping functions and generates and distributes data and strobe signals to the memory dies. Note that FIGS. 4 and 5, which are discussed below, show examples having a memory module copy engine associated with each column of memory dies.

Memory controller 32 provides system data, address, clock, and other control signals to address/control unit 36. Typically these signals will include signals such as chip selects, ID selects, an address bus, a data bus, bank addresses, clock enables, and on die termination signals. Memory controller 32 also provides copy signals to address/control unit 36. In turn, based on copy signals received from memory controller 32, address/control unit 36 signals memory module copy engine 38 to copy data from one memory die to another.

Note that some of the signals that have a particular purpose during normal operation can be repurposed during a copy operation. For example, the address bus normally indicates the address of a memory access operation. However, during a copy operation the address bus can be used to specify the source row and the destination row.

In FIG. 2, memory controller 32 has detected an error in row 40, with the memory die having the error labeled A-ERR. Memory controller 32 signals memory module copy engine 38 via address/control unit 36 to copy the contents of each memory die in row 40 to the memory dies in row 42, as depicted by arrow 44. Accordingly, memory module copy engine 38 performs a sub-rank sparing operation. Since memory module copy engine 38 is provided on memory module 34, the copy operation is very fast. Note that memory module copy engine 38 may be implemented using methods know in the art, such as a source row register and a target row register, along with registers that increment through memory dies and die contents as data is copied from the source row to the destination row.

Figure 3:
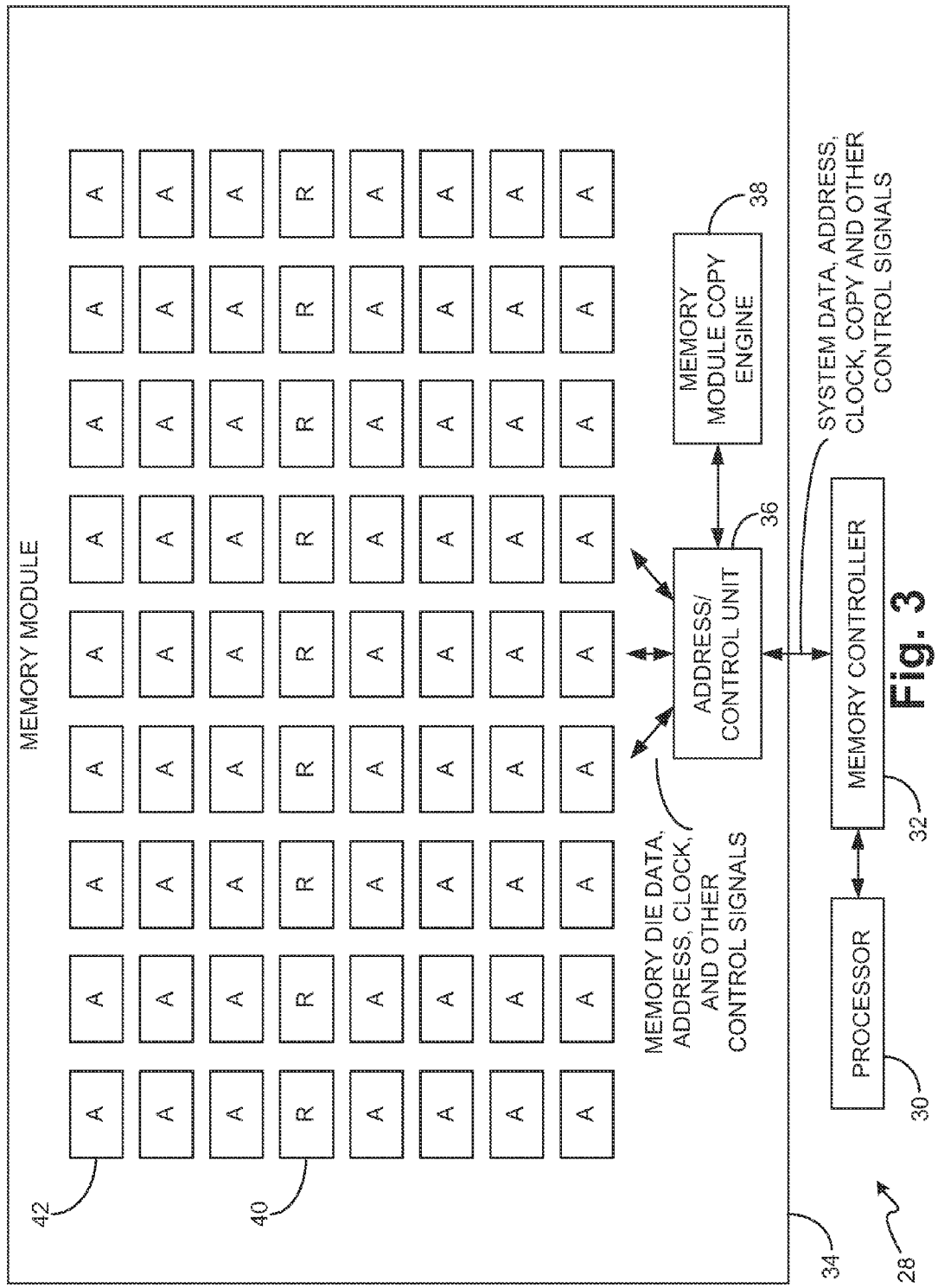
FIG. 3 shows the portion of the computer system of FIG. 2 after a sub-rank sparing operation.

The result of the sub-rank sparing operation is shown in FIG. 3. Note that the status of all memory dies in row 42 has been changed to A for active, and the status of all memory dies in row 40 has been changed to R for retired. Also, address/control unit 36 has been updated to route memory access operations that would have previously been sent to row 40 to row 42. The routing/mapping functionality of address/control unit 34 may be implemented as a table, or other suitable data structure. Note that the data read from the failing die may include errors, no after the copy operation a scrubbing unit, as shown in FIG. 1, may scan relevant memory locations and correct any discovered errors.

Note that in FIG. 2, a single row 42 of spare memory dies is provided. However, additional rows of spare memory dies may be provided to add additional redundancy, thereby allowing continued operation after having memory die errors in multiple rows.

Figure 4:
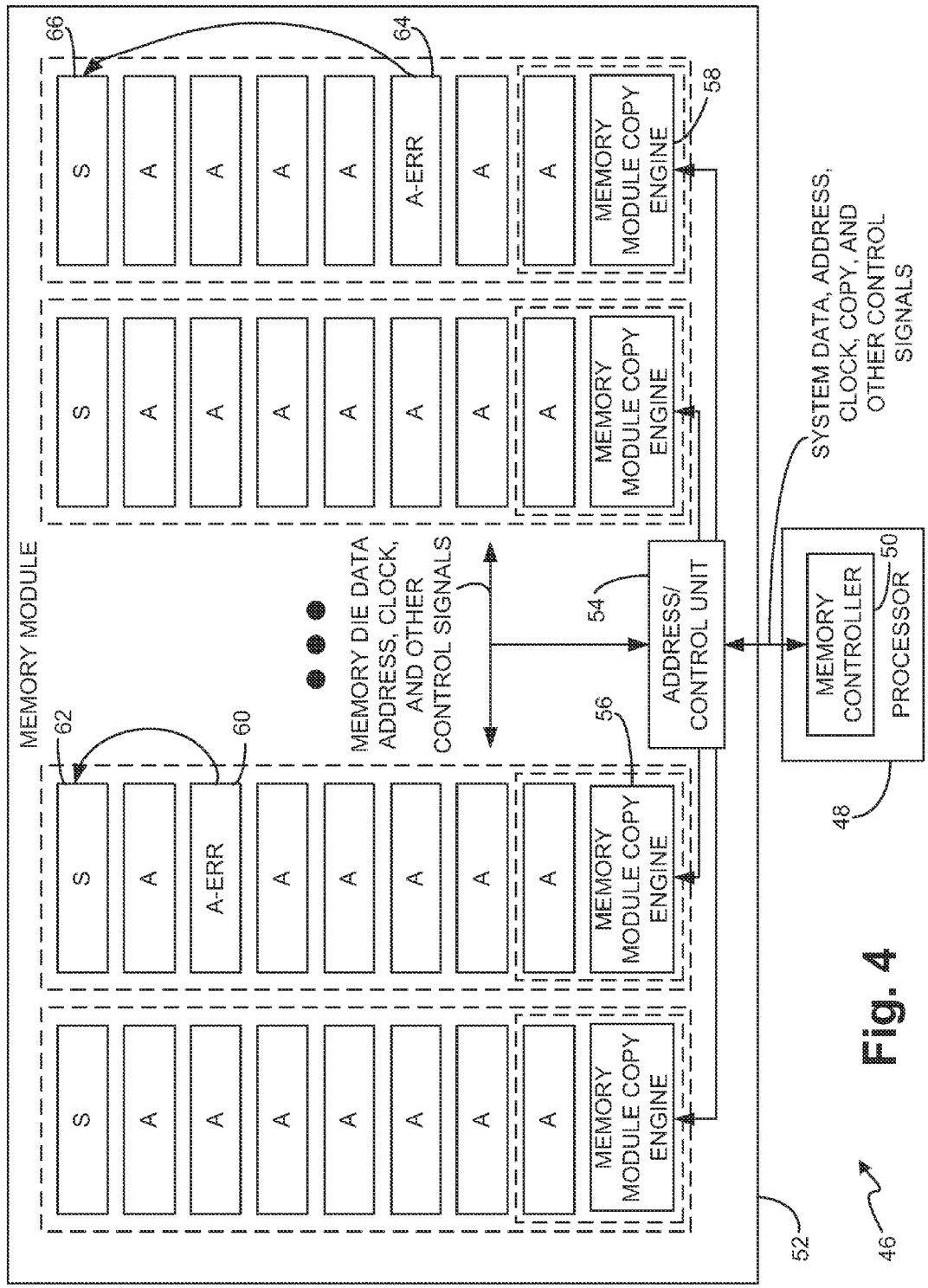
FIG. 4 shows a portion of a computer system that includes processor having an integrated memory controller coupled to a memory module, with each column of memory dies of the memory module including a memory module copy engine.

FIG. 4 shows a portion of a computer system 46 that includes processor 48 having integrated memory controller 50 coupled to memory module 52. For illustrative purposes, some of the columns of dies have been omitted in FIG. 4. Note that computer system 46 may include other components and functions discussed above with respect to computer system 10 of FIG. 1.

Memory module 52 includes address/control unit 54 and a memory module copy engine for each column of memory dies, such as memory module copy engines 56 and 58. Note that address/control unit 54 is provided with copy signals from memory controller 50, along with other signals that facilitate the copy operation. In turn, address/control unit 54 may signal each of the memory module copy engines to perform a copy operation within a column. As discussed above, signals that serve a particular purpose (such as addressing memory cells) during normal memory access operations may be repurposed during memory die sparing operations.

The memory dies may be provided in individual packages, or grouped together using 3DS and TSV technologies. The dashed boxes encompassing each column represent a stack of dies in a single package.

In the example shown in FIG. 4, spare memory dies are provided and managed in each column. Accordingly, the granularity of the sparing is a single memory die, so there is little need to ever retire a good memory die. The memory module copy engines may be implemented as discrete ICs or dies, may be provided in standalone packages, or may be provided in a 3DS stack. Alternatively, a memory module copy engine may be provided on the memory die. In one implementation, the memory module copy engine may be provided on every memory die, with one die assuming a master role. In another implementation, a master die containing the memory module engine may be different from the other die in the column that do not contain a memory module engine, thereby reducing transistor count and reducing costs. In FIG. 4, note that the dashed boxes encompassing each memory module copy engine and an adjacent memory die represent a memory module copy engine being provided a common die with the array of memory cells.

FIG. 4, memory controller 50 has detected that a threshold error rate has been reached for memory die 60 and memory die 64. Accordingly, memory controller 50 signals memory module copy engine 56 via address/control unit 54 to copy the contents of die 60 to die 62, and signals memory module copy engine 58 via address/control unit 54 to copy the contents of die 64 to die 66. The result of the "in column" sparing operations is shown in FIG. 5.

Figure 5:
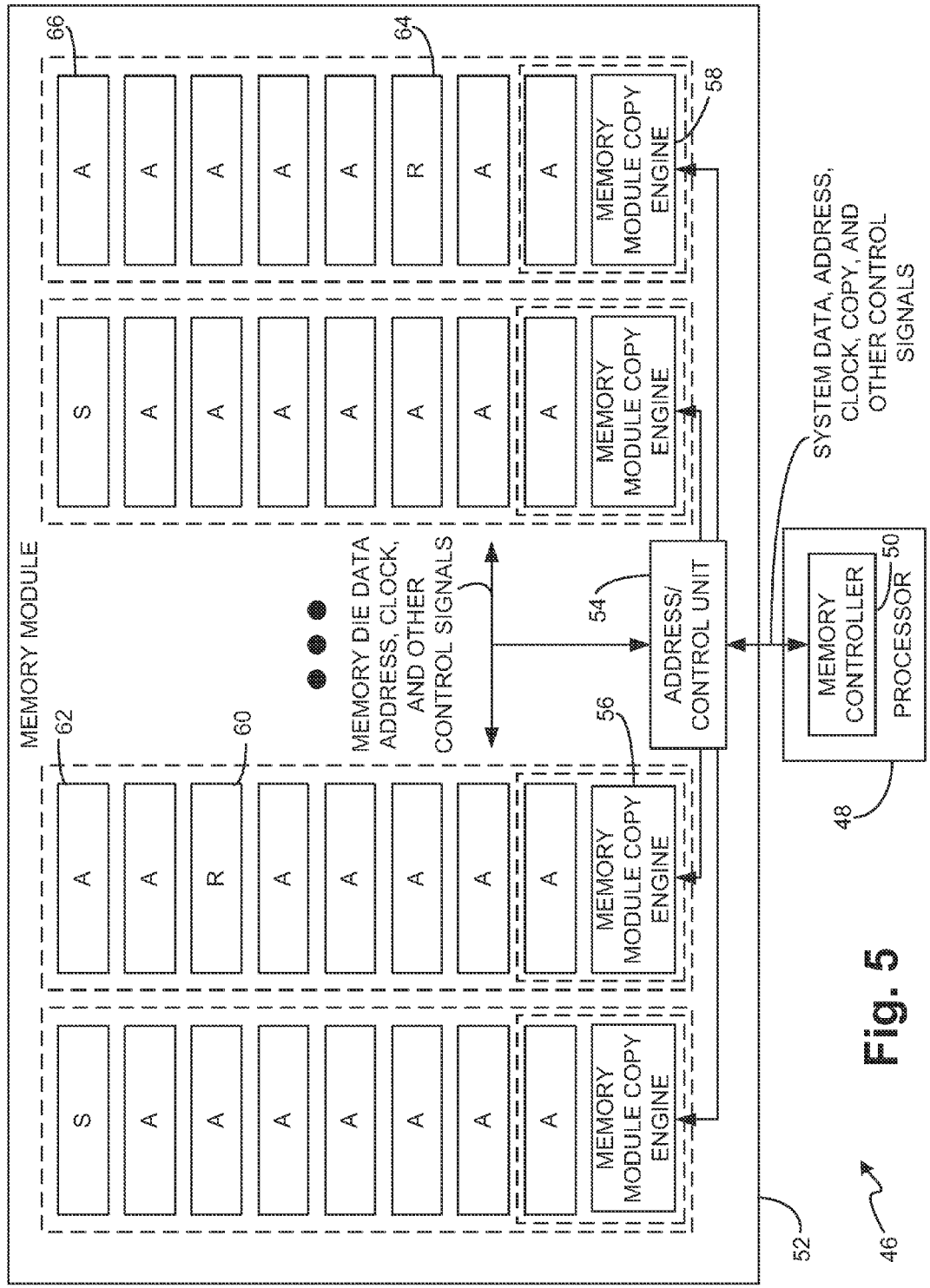
FIG. 5 shows the portion of the computer system of FIG. 4 after an "in column" sparing operation.

In FIG. 5, die 62 and die 66 have been marked as Active, and die 60 and die 64 have been marked as Retired. Furthermore, address/control unit 54 has been updated by memory controller 50 to reflect the new memory die mappings. Note that only a single spare memory die was used for each memory die that was replaced. Accordingly, any of the other columns of memory dies that still have spares can endure a die failure and normal operation may continue. By providing finer granularity for the sparing operations, additional redundancy is achieved. Note that address/control unit 54 may be provided with non-volatile memory so that if module 52 is removed and inserted into another system, the new memory controller can read the previous mappings and observe the prior sparing operations. Alternatively, the new memory controller can reset the previous sparings and retest and re-spare the memory.

Note that in FIG. 4 a single spare memory die is provided in each column. However, additional spare memory die may be provided in each column to allow for multiple memory die to be retired in each column.

Figure 6:
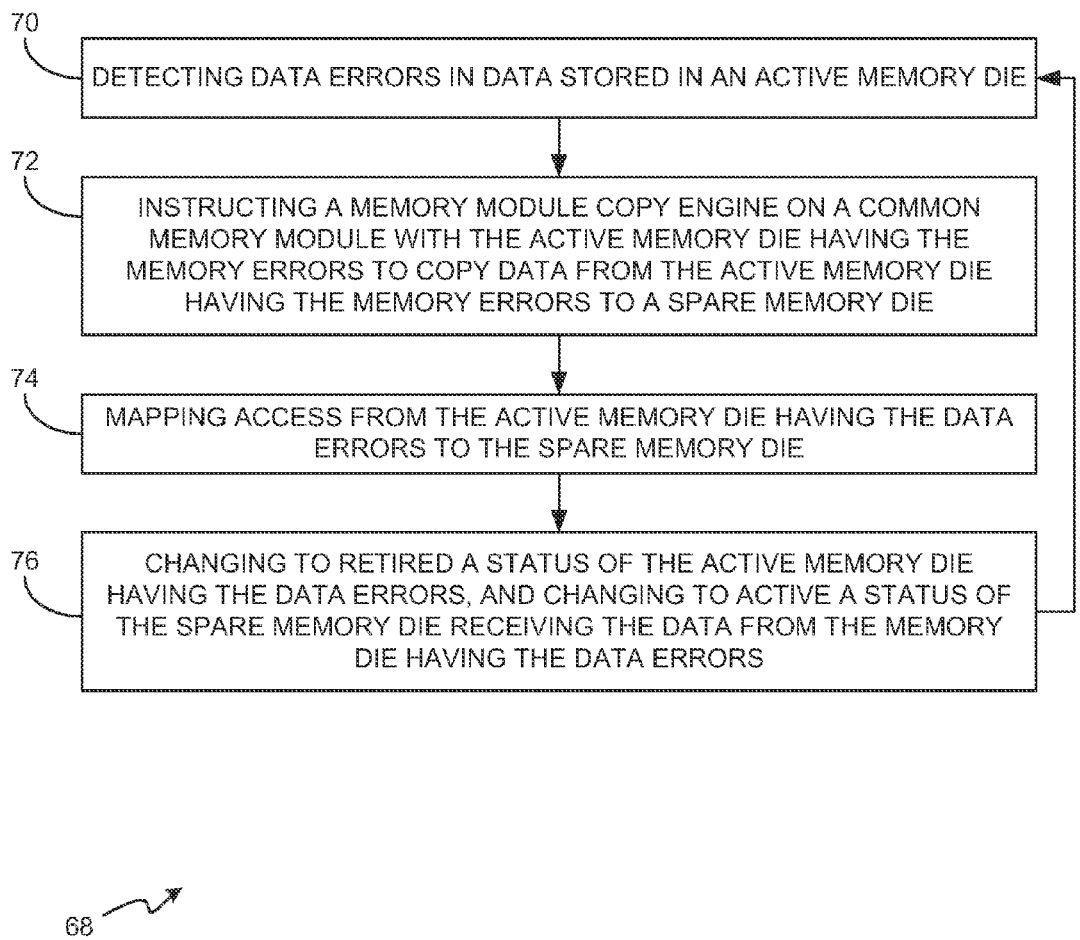
FIGS. 6, 7, and 8 are flowcharts showing example methods.

FIG. 6 is a flowchart 68 showing an example method. Flowchart 68 begins at block 70, where data errors are detected in data stored in an active memory die. Control passes to block 72, where a memory module copy engine that exists on a common memory module with the active memory die having the memory errors is instructed to copy data from the active memory die having the memory errors to a spare memory die. Control passes to block 74.

At block 74, access from the active memory die having the data errors is mapped to the spare memory die, and control passes to block 76. At block 76, a status of the active memory die having the memory errors is changed from Active to Retired, and a status of the spare memory die receiving the data is changed from Spare to Active. Control passes back to block 70 and the flowchart repeats.

Figure 7:
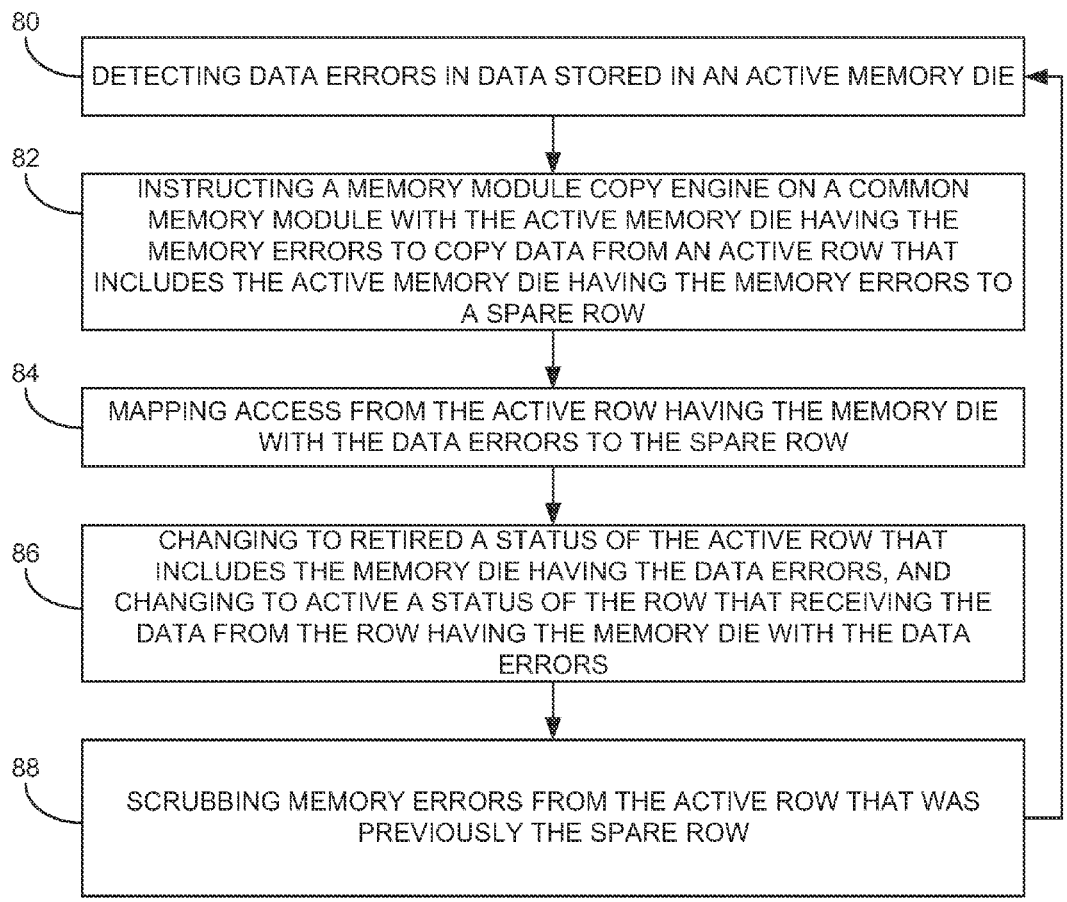

FIG. 7 is a flowchart 78 showing another example method. Flowchart 78 begins at block 80, where data errors are detected in data stored in an active memory die. Control passes to block 82, where a memory module copy engine on a common memory module with the active memory die having the memory errors is instructed to copy data from an active row that includes the active memory die having the memory errors to a spare row. Control passes to block 84.

At block 84, access to the active row having the memory die with the data errors is mapped to the spare row, and control passes to block 86. At block 86, the status of the active row that includes the memory die having the data errors is changed to Retired, and the status of the row that received the data from the row having the memory die with the data errors is change to Active. Control passes to block 88, where memory errors are scrubbed from the active row that was previously the spare row. Control passes back to block 80 and flowchart 78 repeats.

Figure 8:
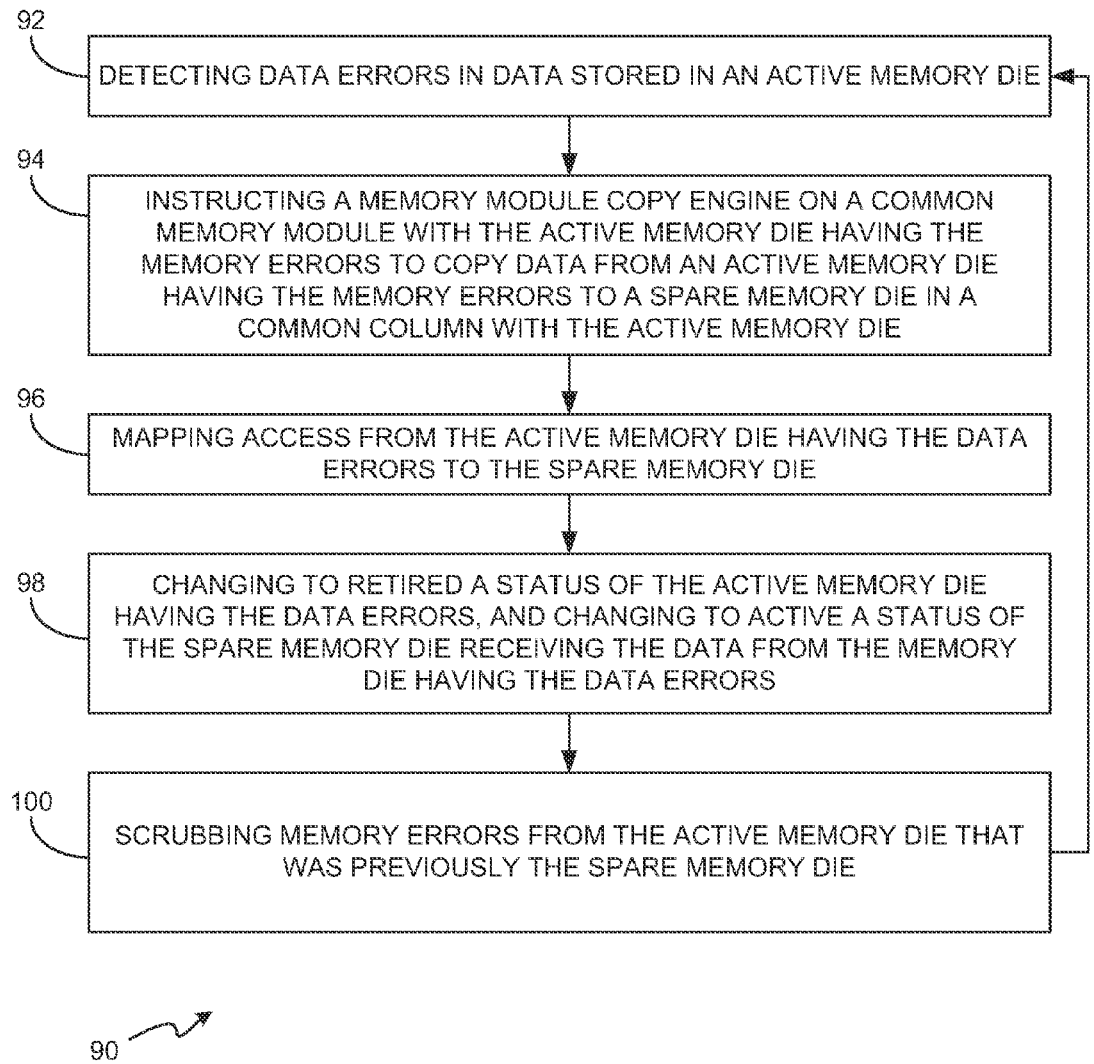

FIG. 8 is a flowchart 90 showing another example method. Flowchart 90 begins at block 92, where data errors are detected in an active memory die. Control passes to block 94. At block 94, a memory module copy engine on a common memory module with the active memory die having the memory errors is instructed to copy data from an active memory die having the memory errors to a spare memory die in a common column with the active memory die. Control passes to block 96.

At block 96, access to the active memory die having the data errors is mapped from the active die to the spare die. Control passes to block 98, where the status of the active memory die having the data errors is changed to Retired, and the status of the spare memory die that received the data from the memory die having the data errors is changed to Active. Control passes to block 100, where memory errors are scrubbed from the active memory die that was previously the spare memory die. Control passes back to block 92 and flowchart 90 repeats.

The examples disclosed herein are well suited to the continuing increase in memory die density within memory modules. The memory module copy engines disclosed herein provide for fast memory die sparing, while also not burdening the memory controller with the task of copying data from a failing memory die to a spare memory die. By providing additional memory die sparing granularity, fewer good memory dies need to be retired, thereby preserving good memory dies for additional redundancy. The examples having "in column" sparing provide highly efficient utilization of spare memory dies since there is a one-to-one replacement of a failing die with a spare die, and no good die are retired. Furthermore, spare die remain available in other columns. The examples disclosed herein provide enhanced redundancy and reliability, white also reducing warranty costs significantly by allowing memory modules having multiple retired memory dies to continue to function normally.

In the foregoing description, numerous details are set forth to provide an understanding of the examples disclosed herein. However, it will be understood by those skilled in the art that the examples may be practiced without these details. While a limited number of examples have been disclosed, those skilled in the art will appreciate numerous modifications and variations therefrom. It is intended that the appended claims cover such modifications and variations as fall within the true spirit and scope of the disclosed examples.

What is claimed is:

1. A memory module comprising:
   an array of memory dies arranged into logical rows and columns, with each memory die capable of assuming a status of spare, active, or retired;
   system data, address, and clock connections for coupling system data, address, and clock signals to a system;
   a number of memory module copy engines for copying data from a failing active memory die to a spare memory die, wherein each of the memory module copy engines is associated with each of the columns of the array of memory dies; and
   an address/control unit for mapping the system data, address, and clock signals to memory data, address, and clock signals corresponding to active memory dies.

2. The memory module of claim 1 wherein all memory dies in a common row have a common status, and rows have the status of spare, active, or retired.

3. The memory module of claim 2 wherein the memory module copy engine copies data from an active row having a failing memory die to a spare row.

4. The memory module of claim 1 wherein at least two memory dies within each column of memory dies have a different status of the spare, active, or retired statuses.

5. A computer system comprising:
   a processor;
   persistent non-transitory storage coupled to the processor;
   a memory controller either external to and coupled with the processor, or integrated within the processor, for generating system memory data, address, and clock signals; and
   a memory module comprising:
     an array of memory dies arranged into logical rows and columns, with each memory die capable of assuming a status of spare, active, or retired;
     an address/control unit for mapping the system memory data, address, and clock signals from the memory controller to memory data, address, and clock signals corresponding to active memory dies; and
     a number of memory module copy engines for copying data from a failing active memory die to a spare memory die, wherein each of the number of memory module copy engines use a source row register and a target row register to copy the data from the failing active memory die.

6. The computer system of claim 5 wherein the memory controller includes an error detection unit for detecting memory errors in the memory module, and upon reaching an error threshold, instructs at least one of the memory module copy engines to copy data from an active memory die that has reached the error threshold to a spare memory die, and instructs the address/control unit to change the status of the active memory die that has reached the error threshold from active to retired, and to change the status of the spare memory die that has received contents of the active memory die that has reached the error threshold from spare to active.

7. The computer system of claim 6 wherein all memory dies in a common row have a common status, rows have the status of spare, active, or retired, and the memory controller instructs the memory module copy engine to copy data from an active row having a memory die that has reached the error threshold to a spare row, and instructs the address/control unit to change the status of the active row containing the memory die that reached the error threshold from active to retired, and to change the status of the spare row that received the contents of the active row containing the memory die that has reached the error threshold from spare to active.

8. The computer system of claim 5 wherein at least two of the memory dies within each column of memory dies have a different status of the spare, active, or retired statuses.

9. The computer system of claim 5 wherein the memory controller includes a scrubbing unit, and upon copying data from a memory die that has reached an error threshold to a spare die, the scrubbing unit scrubs memory by applying error correction.

10. A method comprising:
   detecting data errors in data stored in an active memory die;
   instructing a number of memory module copy engines on a common memory module with the active memory die having the data errors to copy data from the active memory die having the data errors to a spare memory die, wherein:
      each of the number of memory module copy engines is associated with one of the columns of the array of memory dies; and
      the memory module copy engines copy the data using a source row register and a target row register;
      mapping access from the active memory die having the data errors to the spare memory die; and
      changing to retired a status of the active memory die having the data errors, and changing to active a status of the spare memory die receiving the data from the memory die having the data errors.

11. The method of claim 10 and further comprising:
   scrubbing memory errors from the active memory die that was previously the spare memory die.

12. The method of claim 10 wherein all memory dies are organized into logical rows, rows have a status of spare, active, or retired, and the memory module copy engine copies data from an active row to a spare row.

13. The method of claim 10 wherein the memory dies are organized into columns, and each memory die within each column of memory dies has a status of spare, active, or retired, and a number of memory module copy engines are associated with each column of memory dies for copying data from a failing active memory die to a spare memory die within the column.

14. The method of claim 10 wherein the method elements are embodied on a non-transitory computer-readable medium.

* * * * *